United States Patent [19]
Cherian et al.

[11] 4,341,433
[45] Jul. 27, 1982

[54] ACTIVE DEVICE SUBSTRATE CONNECTOR

[75] Inventors: Gabriel B. Cherian, York; William S. Scheingold, Palmyra; Frank C. Youngfleish, Harrisburg, all of Pa.

[73] Assignee: AMP Incorporated, Harrisburg, Pa.

[21] Appl. No.: 147,766

[22] Filed: May 8, 1980

Related U.S. Application Data

[63] Continuation of Ser. No. 38,607, May 14, 1979, abandoned, which is a continuation of Ser. No. 904,645, May 10, 1978, abandoned.

[51] Int. Cl.³ .............................................. H01R 13/22
[52] U.S. Cl. ......................... 339/176 MP; 339/17 CF
[58] Field of Search .......... 339/17 CF, 17 LM, 17 M, 339/75 MP, 176 M, 176 MP, 252 R, 254

[56] References Cited

U.S. PATENT DOCUMENTS

| 2,145,166 | 1/1939 | Douglas | 339/254 R |
| 2,154,247 | 4/1939 | Muldoon et al. | 339/254 R |
| 3,215,968 | 11/1965 | Herrmann | 339/17 LM |
| 3,771,100 | 11/1973 | Reed | 339/17 LM |

Primary Examiner—Joseph H. McGlynn
Attorney, Agent, or Firm—Allan B. Osborne

[57] ABSTRACT

The present invention relates to a connector of the type for electrically connecting an active device substrate unit for a PCB (printed circuit board). More particularly, the invention includes a dual-contact spring member having a buffer section so that forces exerted on one contact are not transmitted to the other contact.

2 Claims, 6 Drawing Figures

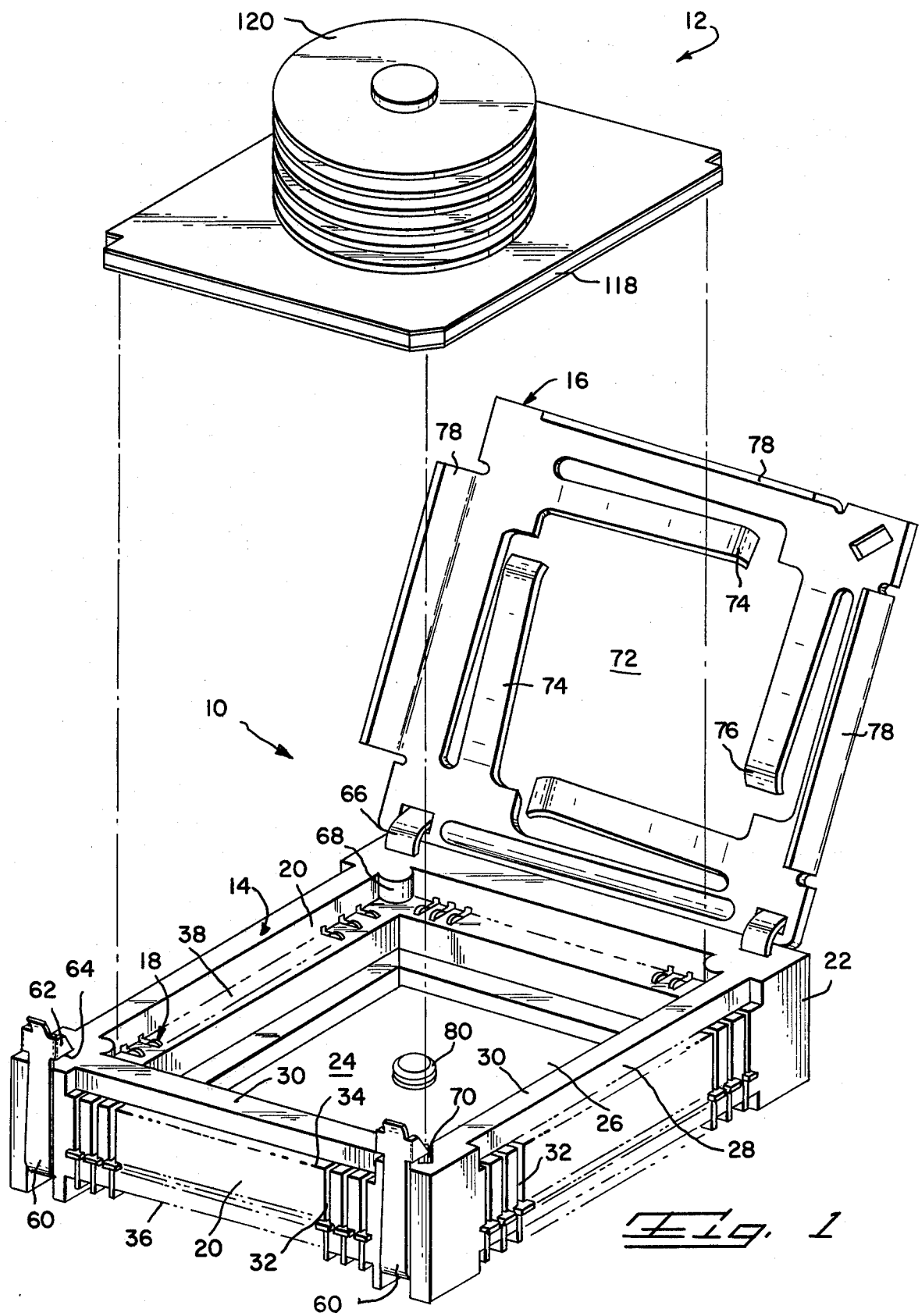

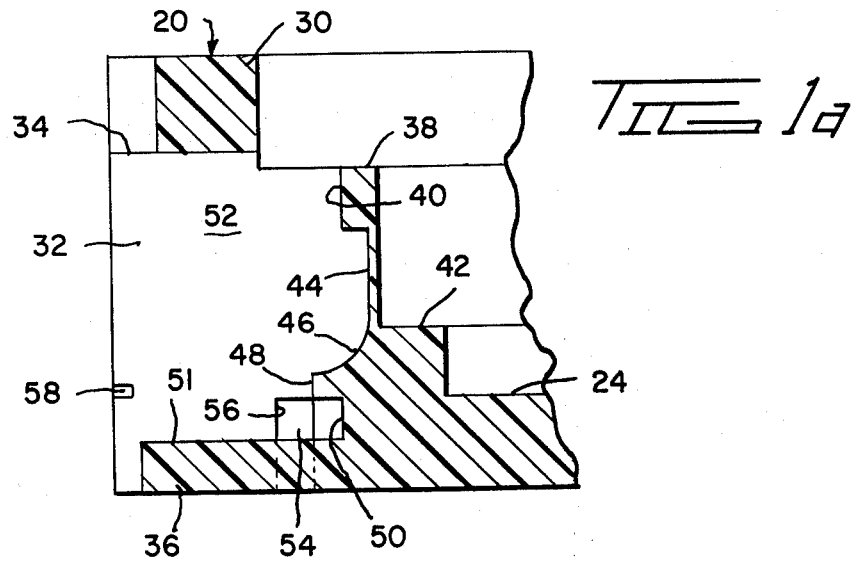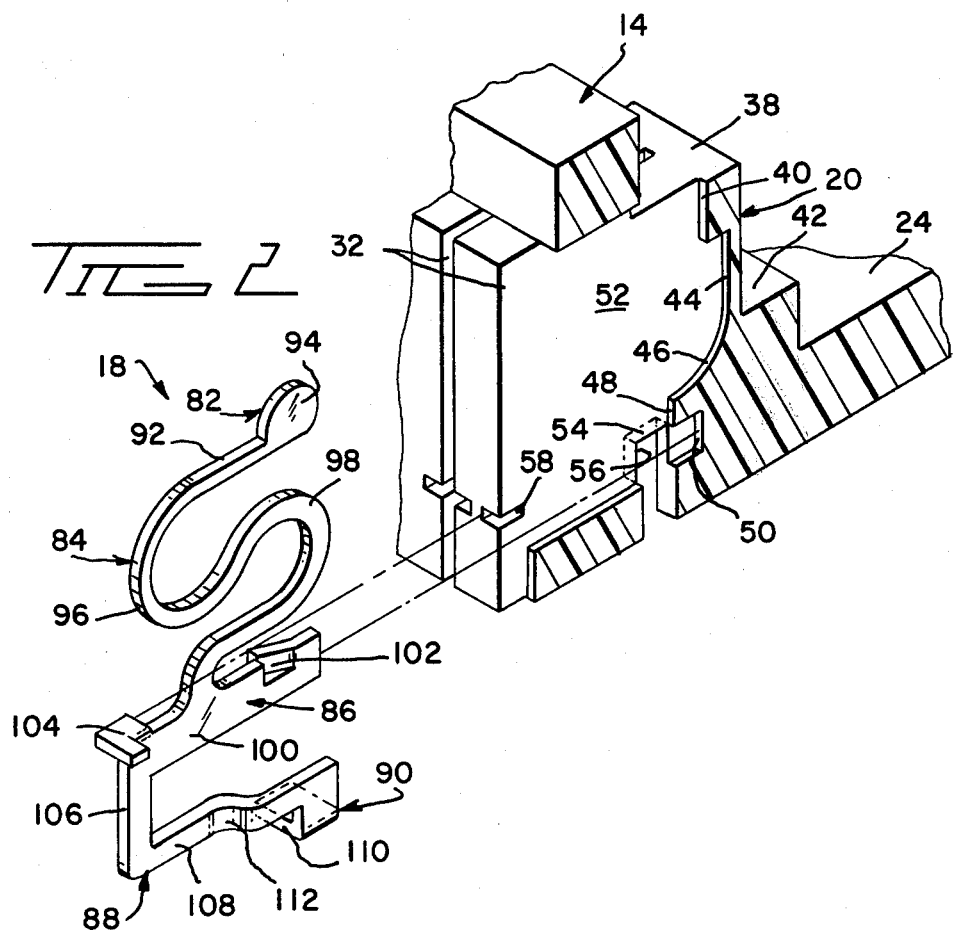

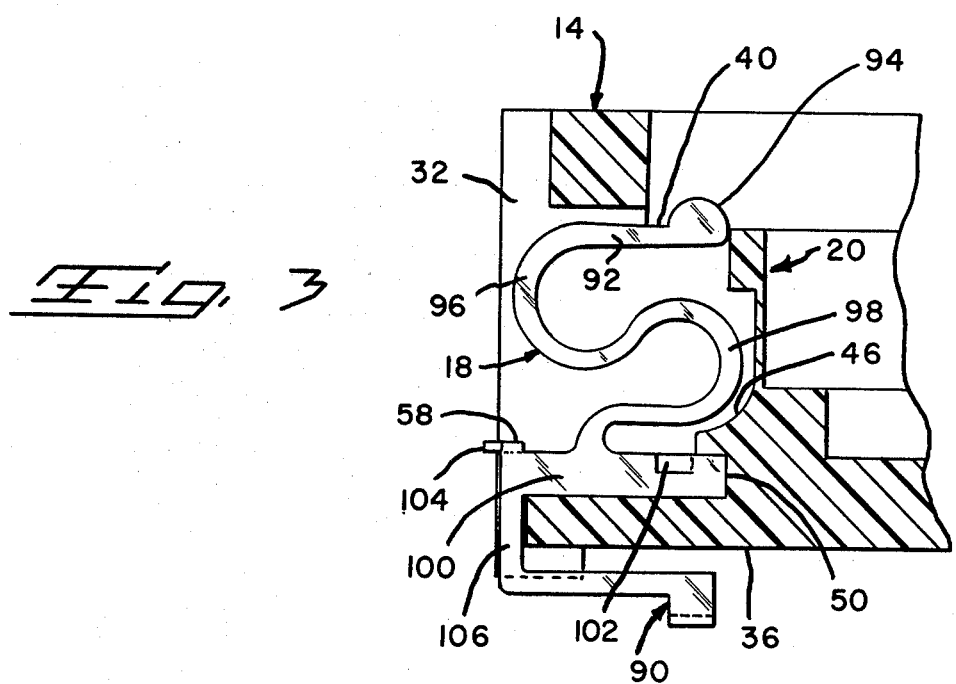
_Fig. 3_
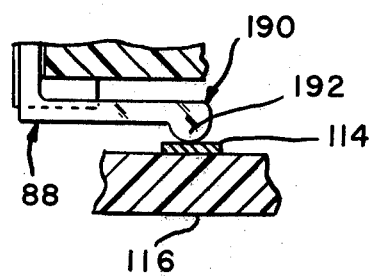
_Fig. 4_
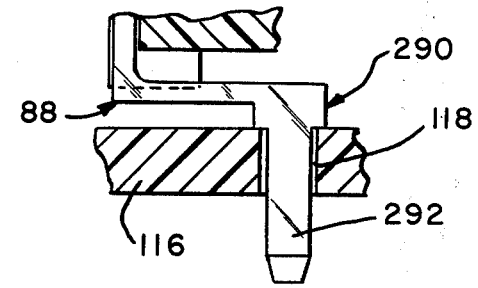
_Fig. 5_

ACTIVE DEVICE SUBSTRATE CONNECTOR

This is a continuation of application Ser. No. 038,607, filed May 14, 1979, now abandoned, which was a continuation of Ser. No. 904,645, filed May 10, 1978, now abandoned.

BACKGROUND OF THE INVENTION

1. Field of the Invention

This invention relates to a connector of the type comprising an insulating housing and a plurality of contact-carrying spring members. An active device substrate unit, positioned in the housing, is connected to the conductive paths on a PCB via the spring members.

2. Prior Art

Representative prior art includes U.S. Pat. Nos. 3,877,064 and 3,940,786, the latter being a CIP of the former. The teachings of both patents relate to surface to surface connectors for connecting active device substrates to a PCB. The connectors include a housing of insulating material having a central compartment. A number of contact-carrying conductive spring members are positioned about the perimeter of the compartment. The substrate is placed in the compartment with the contacts on the upper portion of the spring members contacting the conductive pads on the substrate. The contacts on the lower portion of the spring members contact the conductive paths on the PCB to complete the electrical path.

A relevant teaching is contained in U.S. Ser. No. 851,338, filed Nov. 14, 1977 and now abandoned.

SUMMARY OF THE PRESENT INVENTION

The present invention provides an insulating housing containing a plurality of spring members which provide an electrical connection between an active device substrate unit and a PCB. The spring members have a buffer section which isolates forces exerted against one or the other contact.

BRIEF DESCRIPTION OF THE DRAWINGS

FIG. 1 is a perspective view of the connector of the present invention and a active device substrate with a boat sink attached;

FIG. 1a is a cross-sectional view of one wall of the connector of FIG. 1;

FIGS. 2 and 3 are views of the spring member prior and after being positioned in the connector; and FIGS. 4 and 5 illustrate different lower contact sections on the spring members of the present invention.

DESCRIPTION OF THE PREFERRED INVENTION

The active device substrate connector of the present invention is shown in FIG. 1 and is indicated generally by reference numeral 10. A unit consisting of an active device substrate and an attached heat sink is shown directly above connector 10 and is indicated generally by reference numeral 12. Unit 12 is shown primarily to familiarize the reader with the form or shape of a typical substrate accepted by connector 10. It is not a part of the invention disclosed herein. Connector 10 consists of a square frame 14, cover 16 and spring members 18.

Frame 14 has four vertical walls 20, each terminating in a corner post 22. A floor 24 is common to all walls. The floor and walls define a central, upwardly open compartment 26.

The exterior vertical surface of each wall has a step 28 immediately below the top surface 30 and which extends horizontally from post to post. A plurality of narrow cells 32 which extend into the walls open outwardly from the upwardly facing shoulder 34 of step 28 downwardly through the bottom surface 36 of the wall.

The structure of the interior vertical surface of a wall 20 is shown in FIG. 1a to which attention is now directed. Immediately below top surface 30 is an upwardly facing shoulder 38. Openings 40 leading into cells 32 are located along the shoulder as can be seen in FIG. 1. From shoulder 38 the surface drops straight down to a lower, second upwardly facing shoulder 42. Below this shoulder the surface drops to floor 24.

FIG. 1a also shows in profile the interior shape of a cell 32. The forward or inwardly wall 44 below opening 40 may be characterized as having a recess with a curved lower surface 46 that extends rearwardly or outwardly to form a projection 48. A second recess 50 is provided below and in part by the projection. Floor 51 forms the bottom surface of the cell. One side wall 52 of each cell has a cavity 54 in front of and just below projection 48. The cavity provides an inwardly facing shoulder 56. The outer edge of the two side walls defining the cells contain a horizontal slot 58. These slots may be seen clearly in FIG. 2 which also shows the configuration of a cell.

Corner posts 22, which are shown only in FIG. 1, provide proper stand-off for the connector with respect to the PCB and further provides the structure for hinging and latching cover 16. The two front posts have retaining latches 60. These latches, made from resilient material, have a pair of ears 62 which provide downwardly facing shoulders 64. The front of the ears are beveled so that the cover, in being closed onto frame 14, cams the latches out of the way. Once the cover is past, the latches rebound with the shoulders 64 on top of the cover holding it in place.

The corner posts at the rear of the frame carry hinges 66. These hinges are generally U-shaped with one end embedded or otherwise fixed in the post. The hinge allows cover 16 to be pivoted until it is parallel to the substrate.

The inside surfaces of three posts have cylindrical protuberances 68. The inside corner of the fourth post has a thruster clip 70 in its corner. This clip has a vertical arm (not shown) which biases the substrate against the other three corners. The cylindrical protuberances and thrust clip cooperate to align substrate unit 12 in the compartment.

Cover 16 has a center opening 72 with four hold down springs 74 symmetrically disposed about the opening. Each spring has a free end 76 which curves upwardly as shown. The cover further has a flap 78 depending from each except the back edge. These flaps are received in steps 28 when the cover is placed onto the frame.

Floor 24 of the frame may have a bolt 80 for attachment to a PCB.

The frame 14 is preferably molded from a plastic material marketed by General Electric Company under the tradename "VALOX". Other plastic material can also be used. Cover 16 is preferably made from high carbon steel and heat-treated to a spring temper.

Spring members 18 are shown in FIGS. 2 and 3. With specific attention being directed to FIG. 2, the spring structure will be described. Each spring, made preferably from berylium copper, has five definable sections:

the upper contact section 82, the spring section 84, the retention and buffer section 86, the compliant section 88 and the lower contact section 90. The upper contact section 82 and the spring section 84 comprise the upper portion of spring member 18. The compliant section 88 and lower contact section 90 comprise the lower portion of spring member 18.

Upper contact section 82 consists of a horizontal arm 92 and nose 94. The top surface of the nose has a gold plating over a nickel plating to provide a highly conductive and corrosion resistant contact point.

Spring section 84 includes some of arm 92 and ends at the buffer and retention section 86. The section resembles an S with an upper loop 96 and lower loop 98. The spring section has a normal maximum deflection force of about 80 grams.

Retention and buffer section 86 consists of a horizontal bar 100. A lance 102 is struck out from the bar to point obliquely rearwardly or outwardly. A cross piece 104 is provided on the upper surface of bar 100 at its rearward end. This piece extends laterally from either side of the bar in the manner of a "T".

Compliant section 88 includes vertical arm 106 depending from the rearward end of bar 100 and a horizontal arm 108.

Lower contact section 90 provides the contact which engages a conductive pad on a PCB (not shown). The contact section shown on the spring member in FIG. 2 is referred to as a "surface to solder direct attach tail". The L-shaped structure provides a foot 110 which is soldered to the PCB pad. In this type structure the horizontal arm 108 of the compliant section has a dog leg or jog 112 so that foot 110 will be aligned directly under nose 94 on the upper contact section. Two other lower contact sections are shown in FIGS. 4 and 5 and are discussed below.

FIG. 3 is a side view showing a spring member 18 positioned in a cell 32. Nose 94, in the absence of a substrate unit 12, sticks up through opening 40 on the interior of frame wall 20. Arm 92 and loops 96 and 98 occupy most of cell space with loop 98 being nearest recess 44 and its curved lower surface 46. The forward end of horizontal bar 100 is received in the lower, second recess 50 with the free end of lance 102 sticking into cavity 54. Cross piece 104 is positioned in slots 58 located on both facing side walls. The lower contact section 90 is positioned below bottom surface 36 with the upper portion of vertical arm 106 located in the lowermost portion of the cell.

The spring member is retained in the cell by the combination of structures on the retention and buffer section. Forward or inwardly movement is prevented by the forward end of horizontal bar 100 being lodged in the second recess 50. Vertical movement of the bar is prevented by projection 48 overlying it. Rearward or outward movement is prevented by lance 102 abutting the forwardly or inwardly facing shoulder 56 in cavity 54. Upward movement of the bar of the spring member is prevented by cross piece 104 being in slot 58. Downward movement is prevented by the aforementioned slot and also by bar 100 resting on the horizontal floor 51 of cell 32. Lateral movement of the spring member except for compliant section 88 is prevented by the side walls defining the cell.

In that cross piece 104 extends outwardly away from the frame, it serves as a probe tab for test purposes.

The aforementioned other lower contact sections are shown in FIGS. 4 and 5. As the other sections of the spring member are identical with that shown in FIG. 2, they are not shown again except for compliant section 88. FIG. 4 shows a "surface to surface" lower contact section, indicated by reference numeral 190. This section includes a depending nose 192 which is identical to nose 94 in the upper contact section 82. The lower surface is also plated first with nickel and then gold. Lower contact section 190 makes a surface to surface, pressure contact with pad 114 on PCB 116. In a connector 10 having spring members with lower contact section 190, bolt 80 is used to secure the connector to the PCB.

FIG. 5 illustrates a lower contact section 290 referred to as a "solder tail". An elongated tail 292 extends through an aperture 118 in a PCB 116. Solder secures the tail in the aperture. With the tails being so secured, the connector 10 is fixed to the PCB without use of the bolt.

The "surface to solder direct attach" lower contact section 90 shown in FIG. 2 is secured to a pad on the PCB by solder.

In use, a substrate unit 12 is placed into compartment 26 with the substrate 118 (FIG. 1) resting on the four shoulders 38. The circuit traces (not shown) on the underside of the substrate contact the spring member's noses 94 located in openings 40. Cover 16 is now closed with heat sink 120 sticking up through opening 72. Upon latching the cover, the substrate is pushed down so that its traces make a pressure contact with the noses. The vertical pressure is absorbed by spring section 84. As a novel feature of the spring member, the vertical forces exerted by the substrate unit 12 being secured to the connector affects only the upper portion of the spring members, i.e., the upper contact section 82 and the spring section 84 since the retention section 86 is acting as a buffer. Thus, the design of the lower portion, i.e., the compliant section 88 and the lower contact section 90, is independent of the forces to be exerted against upper portion. Therefore, the upper and lower portions can be designed separately to handle specific force situations since the retention and buffer section acts to isolate the upper portion from the lower portion.

As is well known, a PCB is subject to flexing, bending and other stresses. Some of the stresses occur during handling and mounting. Other stresses are induced by environmental temperature changes. Still other stresses come about through thermal variations generated by the substrate unit. These stresses can and do reach levels where a solder joint breaks mechanically with either a increase in electrical resistance or a complete continuity break. In the "surface to surface" embodiment (lower contact section 190, FIG. 4) such stresses result in increased resistance across the contact points.

The aforementioned problem is eliminated or greatly alleviated by the compliant section 88 on the spring members. The compliant section allows some relative movement between the connector and the PCB so as to preserve the mechanical and electrical integrity of the electrical contact therebetween. The compliant section is able to flex or move in all three directions; i.e., along the X, Y or Z axes. Thus, any stress received by the PCB or any deflection, distortion, deformation, or movement in general between the PCB and the connector is absorbed by the compliant section with the lower contact section (90, 190 or 290) moving with the board and thus remaining static or stationary relative to the board. The actual contact point, being either pressure or solder, is either completely or for the most part, free of the stresses.

Connector 10 offers other advantages. The same frame 14 accepts spring members 18 regardless of the kind of lower contact section present. In the case of the "surface to surface" lower contact section, only bolt 80 needs to be added.

Spring members 18 may be stamped and formed from the same dies throughout most of the operation; only the lower contact section dies differ. Thus, just one stamping and forming line can produce spring members having all three kinds of lower contact sections.

Obvious modifications can be made to the frame particularly. For example, the material below slots 58 may be omitted as the primary function of the slots is to prevent upward movement. The omitted material would open up the slot width that receives the upper portion of vertical arm 106 and increase the compliancy of the compliant section.

The foregoing detailed description has been given for clearness of understanding only, and no unnecessary limitations should be understood therefrom, as some modifications will be obvious to those skilled in the art.

What is claimed is:

1. A connector for electrically connecting an active device substrate to a PCB, comprising:
   a. a frame of insulating material formed by four side walls arranged to define therein between a centrally located, upwardly opened compartment, and ledge extending around the perimeter of the compartment formed by upwardly facing shoulders located on the inwardly facing vertical surfaces of the side walls, said ledge providing support for a substrate which may be positioned in the compartment;
   b. a plurality of narrow cells spaced along and extending into each of the side walls from the outwardly facing vertical surfaces thereof, each cell having an opening into the compartment through the upwardly facing shoulders and a forward wall extending downwardly from the opening to a floor of the cell; and
   c. a plurality of spring members consisting of a horizontal bar with forward and rearward ends, a S-shaped spring section extending upwardly from the bar with a contact on the free end, a vertical arm depending from the rearward end of the bar, a horizontal arm extending forwardly from the vertical arm, and a contact on the horizontal arm, said spring members being positioned in the cells with the horizontal bar supported by the floor so that the contact on the spring section extends through the opening into the compartment for engagement with a substrate which may be positioned therein and with the horizontal arm being beneath the frame so that the contact thereon may engage a conductive trace on a PCB.

2. The connector of claim 1 further including a cavity in a wall of the cells to provide a forwardly facing shoulder and further a recess in the forward wall of the cells adjacent the floor, and a lance attached to and extending obliquely rearwardly from the horizontal bar, said lance adapted to abut the forwardly facing shoulder of the cavity to retain the spring member in the cell and said recess being adapted to receive the forward end of the horizontal bar to retain such against upward movement.

* * * * *